United States Patent
Feng et al.

(10) Patent No.: US 10,249,510 B1
(45) Date of Patent: Apr. 2, 2019

(54) ETCHING METHOD

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Li-Wei Feng, Kaohsiung (TW); Ying-Chiao Wang, Changhua County (TW); Yu-Chieh Lin, Kaohsiung (TW); Tsung-Ying Tsai, Kaohsiung (TW); Chien-Ting Ho, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/908,733

(22) Filed: Feb. 28, 2018

(51) Int. Cl.
  *H01L 21/02* (2006.01)
  *H01L 21/311* (2006.01)
  *H01L 27/105* (2006.01)
  *H01L 21/768* (2006.01)
  *H01L 21/308* (2006.01)

(52) U.S. Cl.
  CPC .. *H01L 21/31144* (2013.01); *H01L 21/76802* (2013.01); *H01L 27/1052* (2013.01); *H01L 21/308* (2013.01)

(58) Field of Classification Search
  CPC ......... B06B 1/0688; G06F 2203/04103; G06F 3/016; G06F 3/041; G06F 3/0414; H01L 21/0337; H01L 21/31053; H01L 21/31116; H01L 41/053; H01L 41/081; H01L 21/31056; H01L 21/31111; H01L 21/31144; H01L 21/76802; H01L 21/312; H01L 27/1052; H01L 21/308; H01L 21/3065
  USPC ....... 438/717, 723, 736, 745, 750, 753, 445, 438/672, 710, 714
  See application file for complete search history.

(56) References Cited

U.S. PATENT DOCUMENTS

| 6,355,538 B1 | 3/2002 | Tseng | |
| 7,701,022 B2 * | 4/2010 | Shimoji | B81C 1/00626 257/419 |
| 9,537,009 B2 * | 1/2017 | Shin | H01L 29/66568 |
| 2006/0046486 A1 * | 3/2006 | Ozawa | G02B 3/0012 438/689 |
| 2015/0203351 A1 * | 7/2015 | Fu | B81C 1/00849 257/774 |

(Continued)

*Primary Examiner* — Lan Vinh
(74) *Attorney, Agent, or Firm* — Winston Hsu

(57) ABSTRACT

An etching method including the following steps is provided. A substrate is provided first. A first region and a second region adjacent to the first region are defined on the substrate. A material layer is formed on the substrate. A pattern mask is formed on the material layer. The patterned mask includes a first part covering the material layer on the first region and a second part including a lattice structure. The lattice structure includes a plurality of openings and a plurality of shielding parts. Each opening exposes a part of the material layer on the second region. Each shielding part is located between the openings adjacent to one another. Each shielding part covers a part of the material layer on the second region. An isotropic etching process is then performed to remove the material layer exposed by the openings and the material layer covered by the shielding parts.

10 Claims, 14 Drawing Sheets

(56) References Cited

U.S. PATENT DOCUMENTS

2016/0254114 A1\* 9/2016 Fomani .................. H01J 1/304
445/50

\* cited by examiner

ETCHING METHOD

BACKGROUND OF THE INVENTION

1. Field of the Invention

The present invention relates to an etching method, and more particularly, to an etching method for improving etching uniformity.

2. Description of the Prior Art

With the advancement of technology, the development of semiconductor processes is ongoing. A modern chip is allowed to have a plurality of various electronic circuits configured within. The semiconductor process for manufacturing the chips may include many steps, such as a deposition process for forming a film, a photoresist coating, an exposure process, and a develop process for forming a patterned photoresist, and an etching process for patterning the film. The types of the etching processes may be substantially divided into isotropic etching processes and anisotropic etching processes. Generally, the critical dimension (CD) control is better in the anisotropic etching process, and the anisotropic etching process is applied to form smaller patterns and/or parts with higher accuracy requirement on the CD control. Comparatively, the isotropic etching process is used in the manufacturing process of the integrated circuits also because of the merits such as higher etching selectivity and higher etching rate. For ensuring the etching effect, the etching time is generally increased for generating an over etching effect in the isotropic etching process. However, a material layer covered by a mask (such as a photoresist) is laterally etched by the over etching effect, and the lateral etching effect may be influenced by some factors such as the topography and may vary by the factors. Accordingly, the etching uniformity may become worse and the manufacturing process may be influenced.

SUMMARY OF THE INVENTION

An etching method is provided in the present invention. A patterned mask including a lattice structure is used to perform an isotropic etching process. The isotropic etching process is used to remove a material layer covered by the lattice structure of the patterned mask for improving the etching uniformity.

According to an embodiment of the present invention, an etching method is provided. The etching method includes the following steps. A substrate is provided first. A first region and a second region adjacent to the first region are defined on the substrate. A material layer is formed on the substrate, and a patterned mask is formed on the material layer. The patterned mask includes a first part and a second part. The first part covers the material layer on the first region. The second part is located corresponding to the second region, and the second part includes a lattice structure. The lattice structure includes a plurality of openings and a plurality of shielding parts. Each of the openings exposes a part of the material layer on the second region. Each of the shielding parts is located between the openings adjacent to one another, and each of the shielding parts covers a part of the material layer on the second region. An isotropic etching process is then performed to remove the material layer exposed by the openings and the material layer covered by the shielding parts.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 and FIG. 2 are schematic drawings illustrating an etching method according to a first embodiment of the present invention, wherein FIG. 2 is a schematic drawing in a step subsequent to FIG. 1.

FIGS. 3-9 are schematic drawings illustrating an etching method according to a second embodiment of the present invention, wherein FIG. 4 is a schematic drawing in a step subsequent to FIG. 3, FIG. 5 is a cross-sectional diagram taken along a line A-A' in FIG. 4, FIG. 6 is a schematic drawing in a step subsequent to FIG. 4, FIG. 7 is a schematic drawing in a step subsequent to FIG. 5, FIG. 8 is a schematic drawing illustrating the corresponding condition between openings of a patterned mask and conductive lines on a substrate, and FIG. 9 is a cross-sectional diagram taken along a line B-B' in FIG. 8.

FIGS. 10-12 are schematic drawings illustrating an etching method according to a third embodiment of the present invention, wherein FIG. 11 is a schematic drawing in a step subsequent to FIG. 10, and FIG. 12 is a schematic drawing illustrating the corresponding condition between openings of a patterned mask and conductive lines on a substrate.

DETAILED DESCRIPTION

Figure 1:
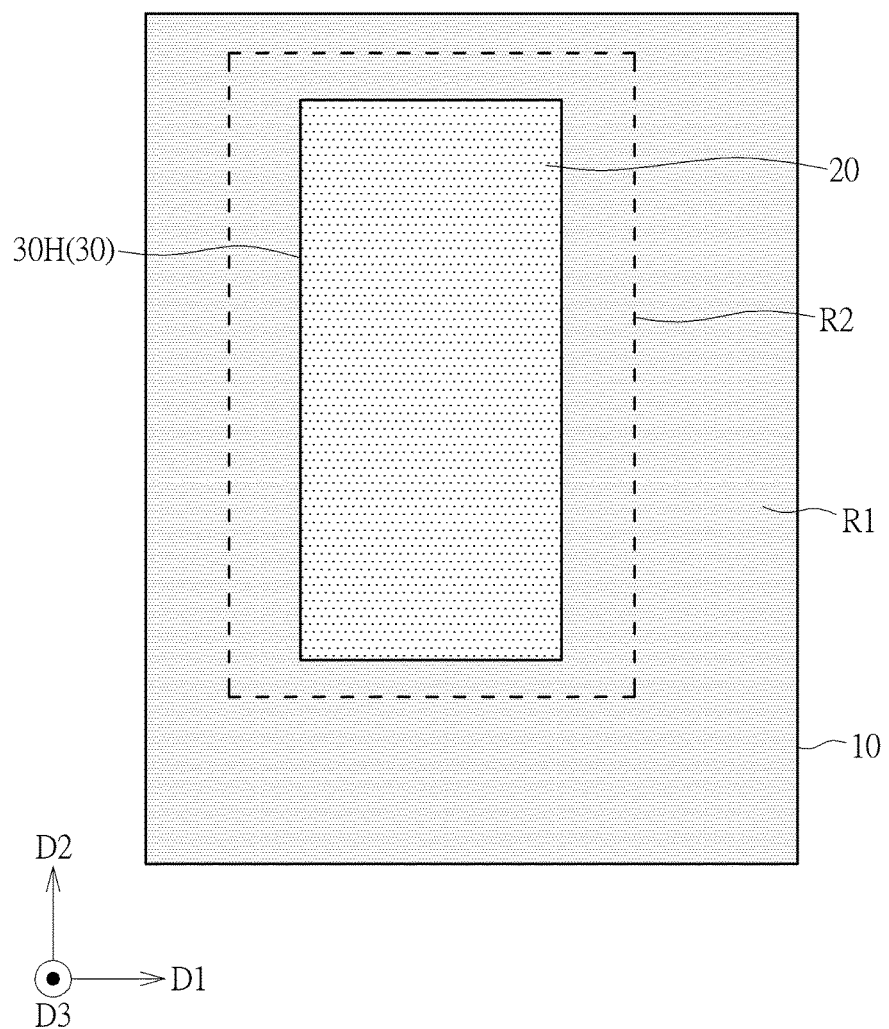
Figure 2:
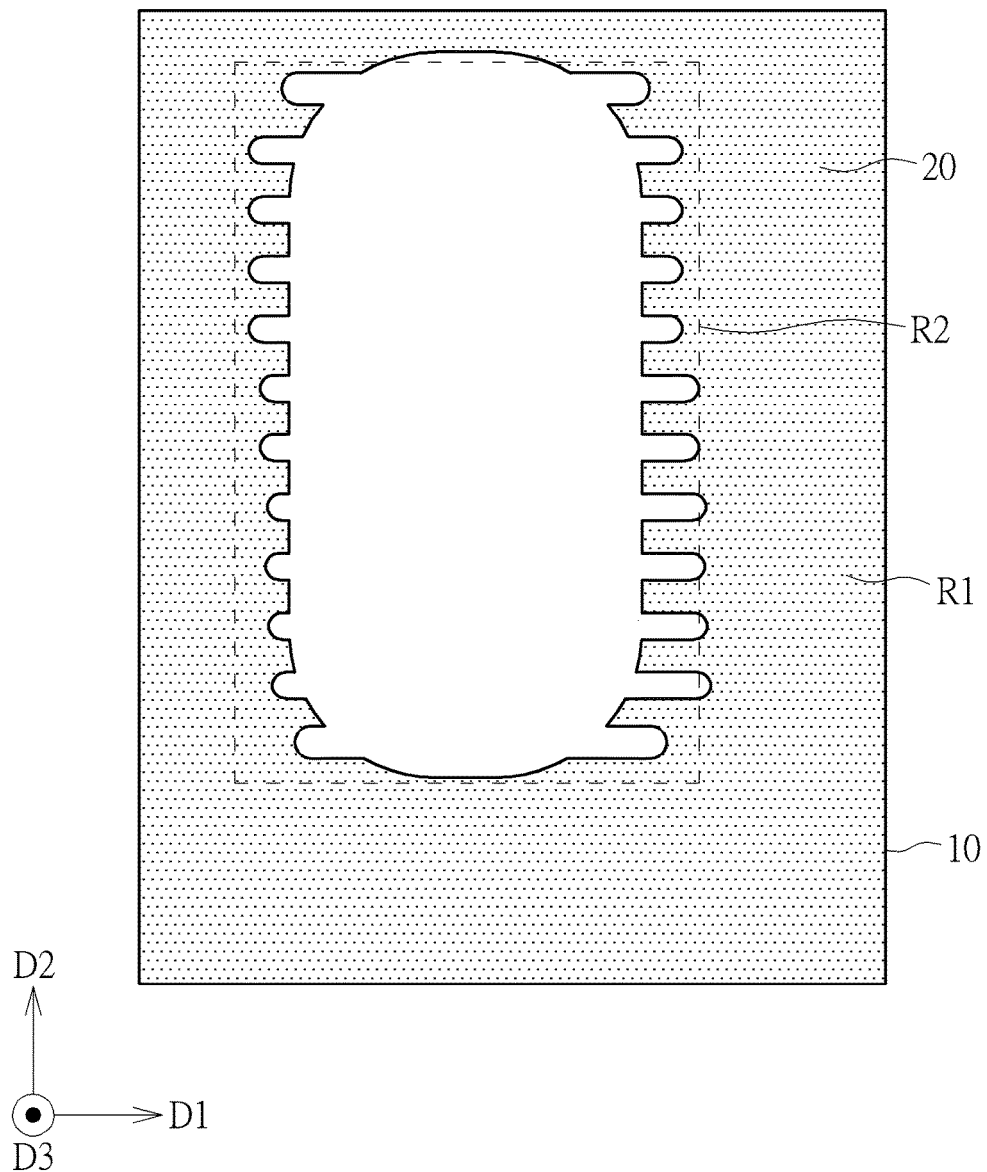

Please refer to FIG. 1 and FIG. 2. FIG. 1 and FIG. 2 are schematic drawings illustrating an etching method according to a first embodiment of the present invention. FIG. 1 and FIG. 2 are top view drawings, and FIG. 2 is a schematic drawing in a step subsequent to FIG. 1. The etching method in this embodiment includes the following steps. As shown in FIG. 1, a substrate 10 is provided. A first region R1 and a second region R2 adjacent to the first region R1 are defined on the substrate 10. Subsequently, a material layer 20 is formed on the substrate 10, and a patterned mask 30 is formed on the material layer 20. The patterned mask 30 in this embodiment includes a single opening 30H located corresponding to the second region R2. In other words, the single opening 30H exposes a part of the material layer 20 located on the second region R2, and an etching process may be used to remove at least most of the material layer 20 on the second region R2.

In some embodiments, the first region R1 may surrounds the second region R2, but not limited thereto. In other words, other allocation approaches of the first region R1 and the second region R2 are within the contemplated scope of the present invention. The substrate 10 may include a semiconductor substrate or a non-semiconductor substrate. The semiconductor substrate mentioned above may include a silicon substrate, a silicon germanium substrate, or a silicon-on-insulator (SOI) substrate, and the non-semiconductor substrate mentioned above may include a glass substrate, a plastic substrate, or a ceramic substrate, but not limited thereto. For example, when the substrate 10 includes a semiconductor substrate, other patterned structures such as a memory cell, a transistor unit and/or a part thereof may be formed on the semiconductor substrate before the step of forming the material layer 20 according to some considerations, but not limited thereto. For instance, in this embodiment, the second region R2 may include a memory cell region, the first region R1 may include a peripheral circuit region, and conductive lines (such as bit lines in the memory cell region, but not limited thereto) may be formed in the first region R1 and the second region R2.

In this situation, when an isotropic etching process (such as a wet etching process) is performed to the material layer 20 on the second region R2, the single opening 30H of the patterned mask 30 is smaller than the area of the second region R2 because the lateral etching of the isotropic etching process has to be considered. However, the lateral etching performance on some regions corresponding to the single opening 30H (such as regions around the corners of the single opening 30H) tends to be influenced by the loading effect and be different from the lateral etching performance on other regions. The lateral etching difference may be deteriorated by the topography under the material layer 20 (such as the influence of the conductive lines mentioned above). As shown in FIG. 2, the uneven residue of the material layer 20 will remain at the corner parts of the second region R2 unevenly after the isotropic etching process and the step of removing the patterned mask. The non-uniform etching performance will influence other processes performed subsequently, and the manufacturing yield may be affected accordingly.

Figure 3:
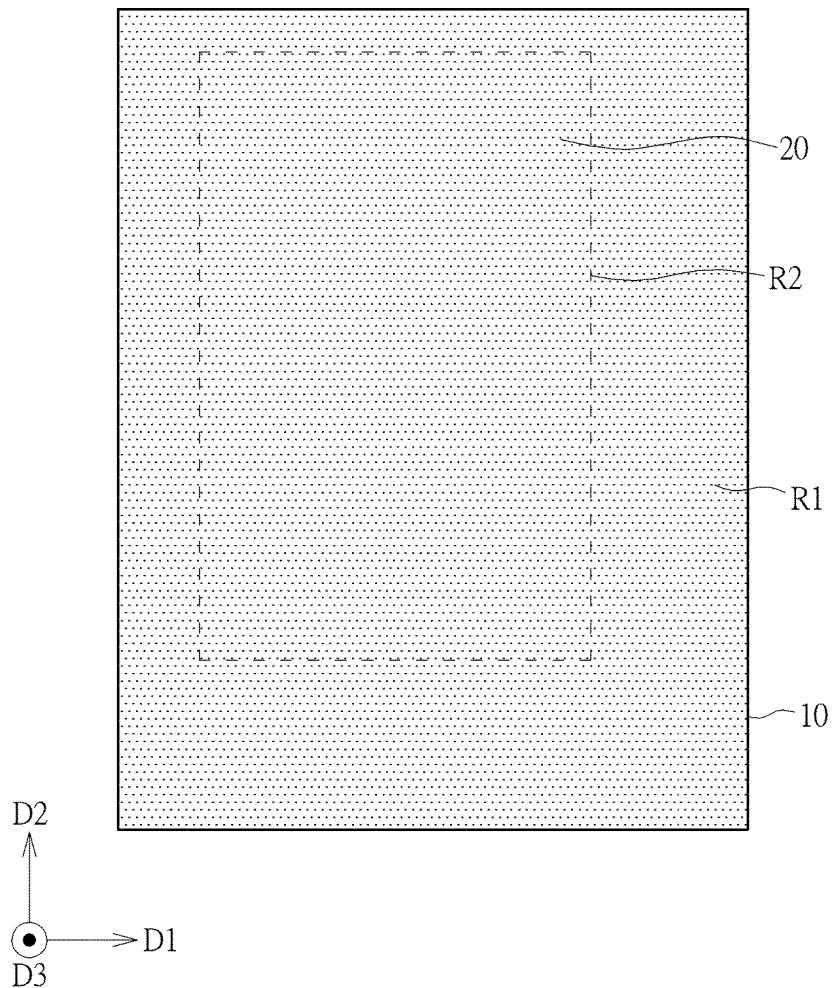
Figure 4:
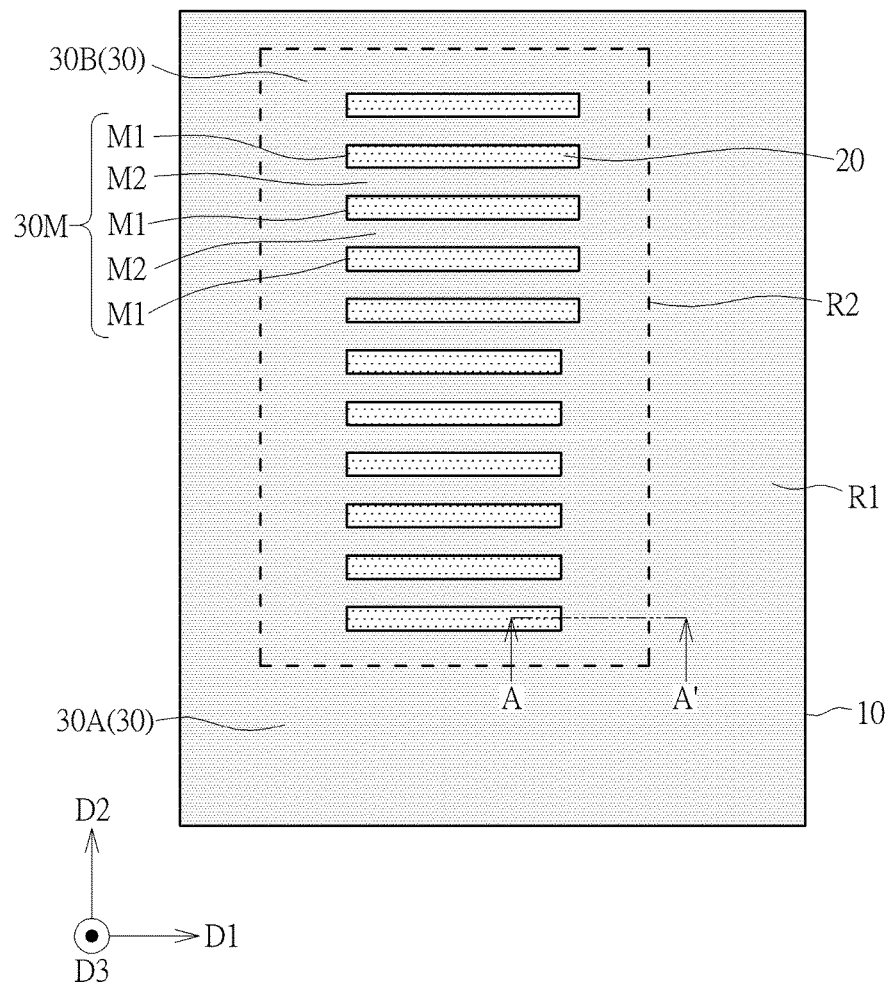
Figure 5:
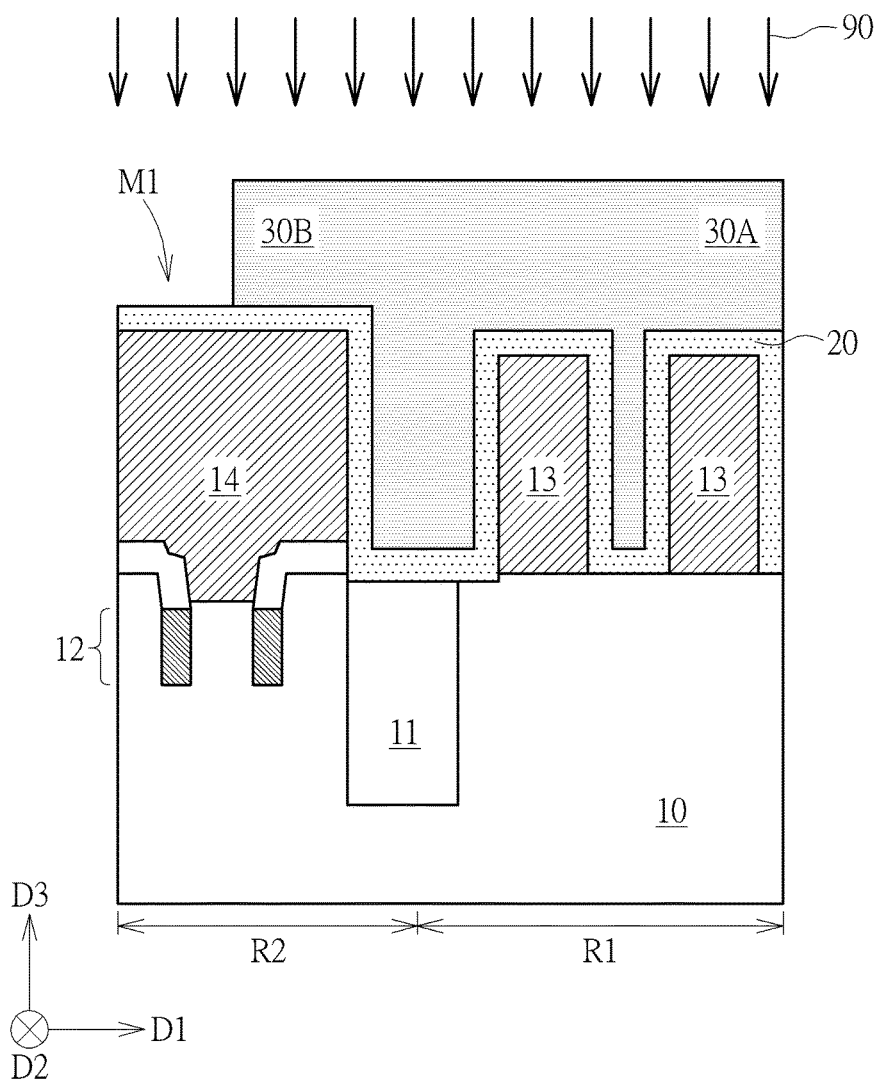

Please refer to FIGS. 3-9. FIGS. 3-9 are schematic drawings illustrating an etching method according to a second embodiment of the present invention. The etching method in this embodiment includes the following steps. As shown in FIG. 3, the substrate 10 is provided. The first region R1 and the second region R2 adjacent to the first region R1 are defined on the substrate 10. As shown in FIGS. 3-5, the material layer 20 is formed on the substrate 10, and the material layer 20 is fully formed on the substrate 10 substantially. In other words, the material layer 20 is formed on the first region R1 and the second region R2. Subsequently, a patterned mask layer 30 is formed on the material layer 20. The difference between the etching method in this embodiment and the etching method in the first embodiment is that the patterned mask 30 in this embodiment includes a first part 30A and a second part 30B. The first part 30A covers the material layer 20 on the first region R1. The second part 30B is located corresponding to the second region R2, and the second part 30B includes a lattice structure 30M. The lattice structure 30M includes a plurality of openings M1 and a plurality of shielding parts M2. Each of the openings M1 exposes a part of the material layer 20 on the second region R2. Each of the shielding parts M2 is located between the openings M1 adjacent to one another, and each of the shielding parts M2 covers a part of the material layer 20 on the second region R2.

Figure 7:
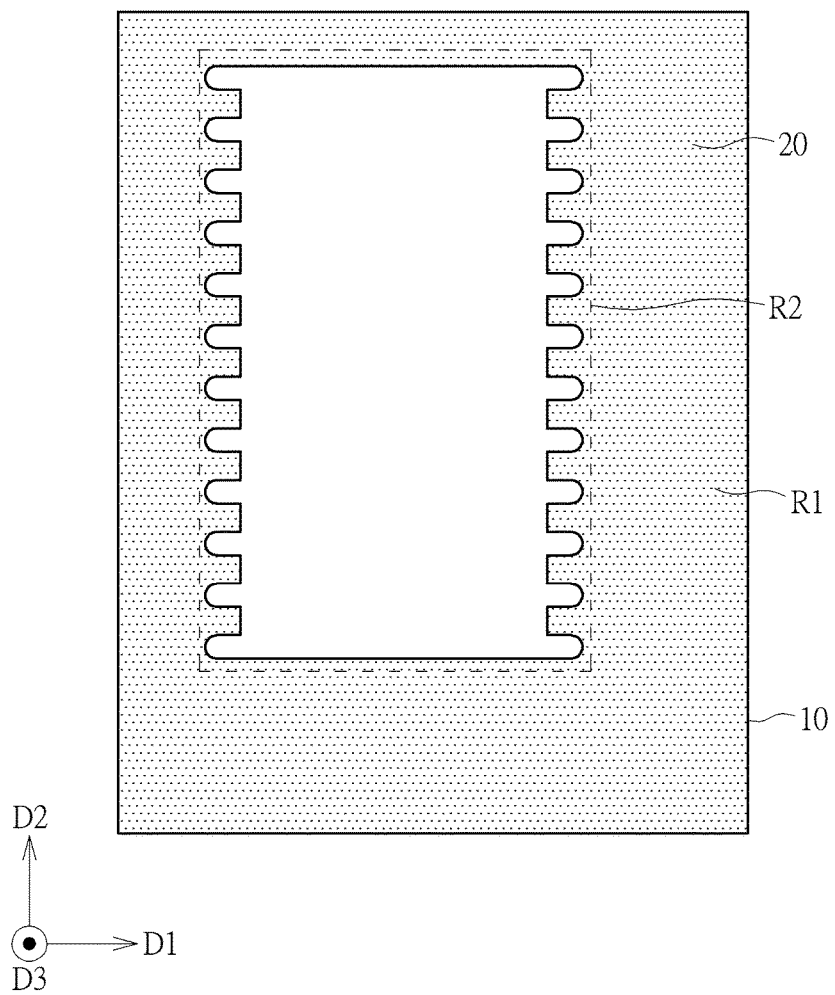

In some embodiments, each of the openings M1 may be elongated in a first direction D1, the openings M1 may be repeated arranged in a second direction D2, and the first direction D1 may be orthogonal to the second direction D2, but not limited thereto. In other words, lattice structures formed by other allocation approaches are within the contemplated scope of the present invention. Subsequently, an isotropic etching process 90 is performed to remove the material layer 20 exposed by the openings M1 and the material layer 20 covered by the shielding parts 20. The isotropic etching process 90 may include a wet etching process, but not limited thereto. Because of the lateral etching characteristic of the isotropic etching process 90, the material layer 20 covered by the shielding parts M2 may be removed by the lateral etching approach, and the material layer 20 covered by the shield parts M2 may be completely removed by the lateral etching of the isotropic etching process 90 preferably. The uniformity of the etching loading effect in the second region R2 during the isotropic etching process 90 performed with the lattice structure 30M may be improved because the material layer 20 covered by the shielding parts M2 has to be removed by the lateral etching. FIG. 7 is a schematic drawing illustrating the condition after the isotropic etching process 90 and the step of removing the patterned mask 30. As shown in FIG. 4 and FIG. 7, the patterned mask 30 having the lattice structure 30M in this embodiment may be used to improve the etching uniformity of the material layer 20 located at the corners of the second region R2, and that will benefit other processes performed subsequently and enhance the manufacturing yield.

Figure 6:
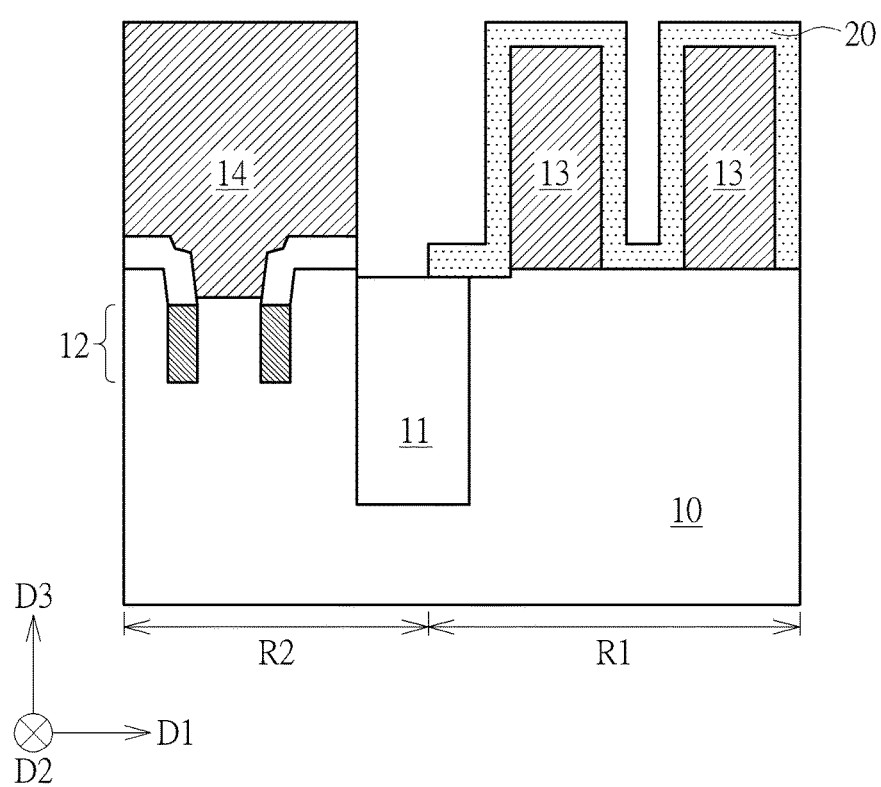

As shown in FIG. 5 and FIG. 6, in this embodiment, the second region R2 may include a memory cell region, and the first region R1 may include a peripheral circuit region, but not limited thereto. For example, the substrate 10 may further include a plurality of patterned structures (such as gate structures 13 shown in FIG. 5) located in the first region R1, the substrate 10 may further include a plurality of conductive lines (such as a first conductive line 12 and a second conductive line 14 shown in FIG. 5) located in the second region R2, and the first region R1 may be separated from the second region R2 by a shallow trench isolation 11 formed in the substrate 10. In some embodiments, the first conductive line 12 may include a word line connected with a plurality of memory cells (not shown), and the second conductive line 14 may include a bit line connected with the memory cell, but not limited thereto. The word line mentioned above may include a buried word line formed in the substrate 10, and the bit line may be formed by the same process of forming the gate structure 13 and include stacked material layers such as a silicon layer, a metal layer, and/or a cap layer, but not limited thereto. In the above-mentioned condition, the material layer 20 may include a spacer material layer conformally formed on the conductive lines (such as the second conductive lines 14) and the gate structures 13. Therefore, the material layer 20 formed on the sidewalls of the second conductive line 14 may be thicker relatively in a vertical direction D3, and the material layer 20 will remain on the sidewall of the second conductive line 14 or on the top surface of the second conductive line 14 after the isotropic etching process 90 when the uniformity of the lateral etching in the isotropic etching process 90 varies. However, the patterned mask 30 having the lattice structure 30M in this embodiment may be used to improve the lateral etching uniformity in the second region R2 during the isotropic etching process 90. FIG. is a schematic drawing illustrating the condition after the isotropic etching process 90 and the step of removing the patterned mask 30. As shown in FIG. 6, the etching method in this embodiment may improve the residue issue of the material layer 30 on the second conductive line 14.

Figure 8:
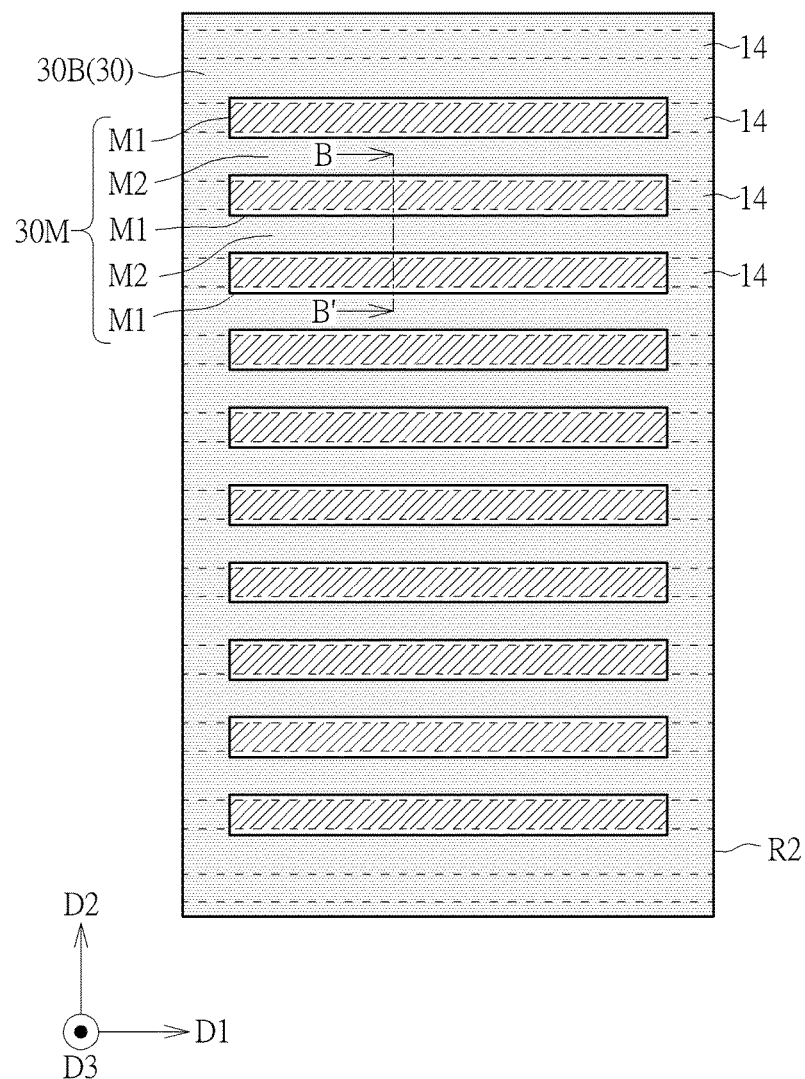
Figure 9:
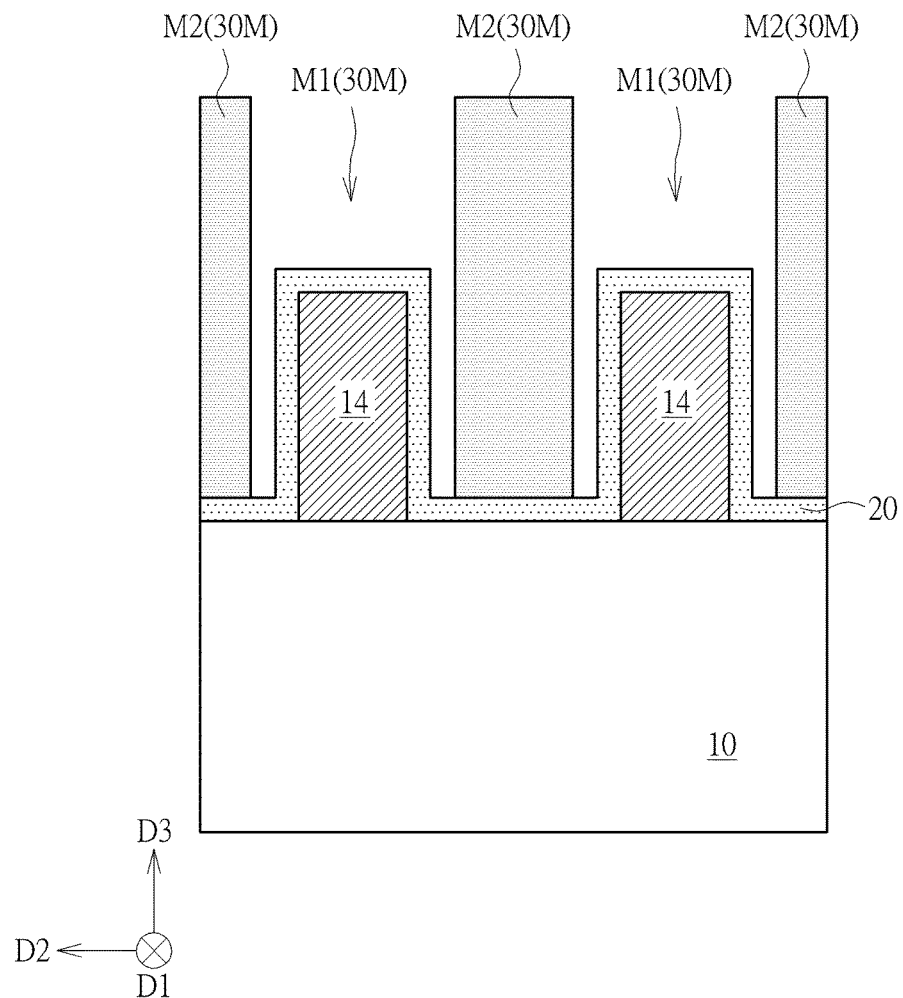

The relative relation between the openings M1 of the patterned mask 30 and the conductive lines (such as the second conductive lines 14) may be referred by the condition shown in FIG. 8 and FIG. 9, but not limited thereto. As shown in FIG. 8 and FIG. 9, in some embodiments, each of the second conductive lines 14 may be elongated in the first direction D1, and the second conductive lines 14 are repeatedly arranged in the second direction D2. Each of the openings M1 is located corresponding to a part of at least one of the second conductive lines 14 in the vertical direction D3, and each of the shielding parts M2 covers at least a part of the material layer 20 located between two of the second conductive lines 14 adjacent to each other. The lateral etching uniformity and/or the etching rate of the material layer 20 located at two ends of each second conductive line 14 in the first direction D1 and covered by the second part 30B of the patterned mask 30 in the isotropic etching process may be improved by the shielding parts M2 covering at least a part of the material layer 20 between the second conductive lines 14 adjacent to one another. The uneven residue of the material layer 20 at the corners of the second region R2 may be avoided accordingly.

Figure 10:
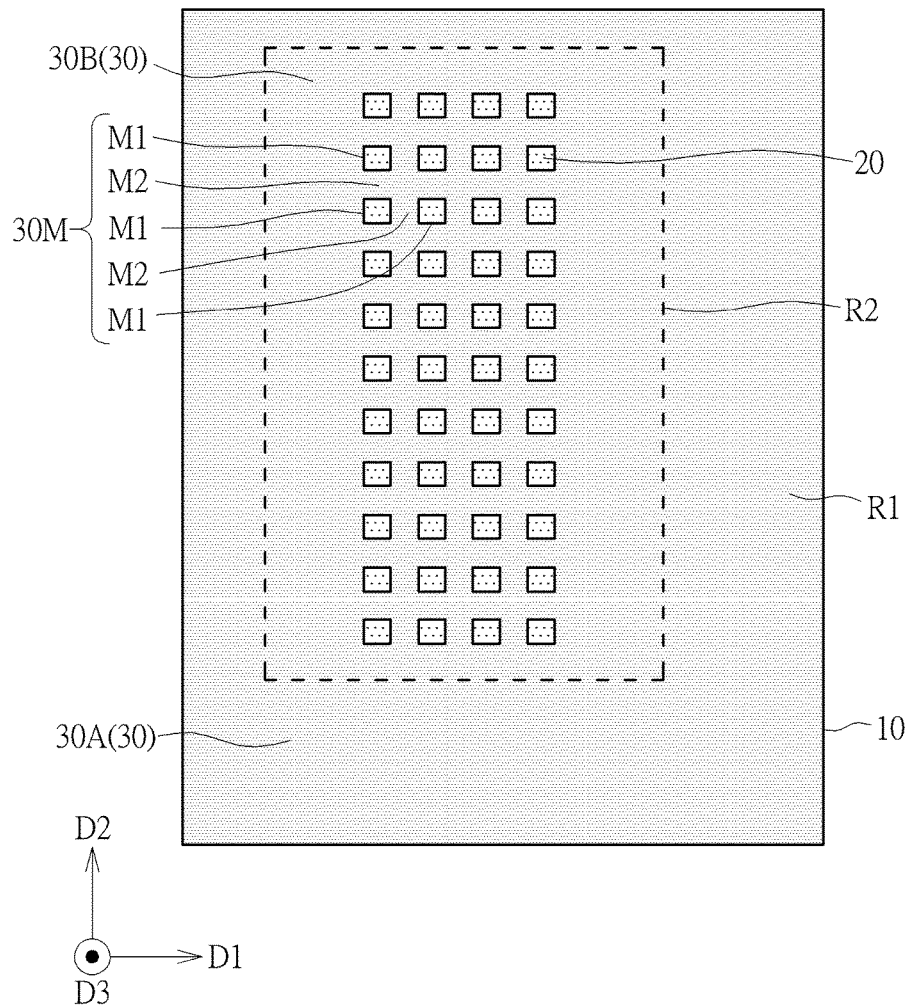
Figure 11:
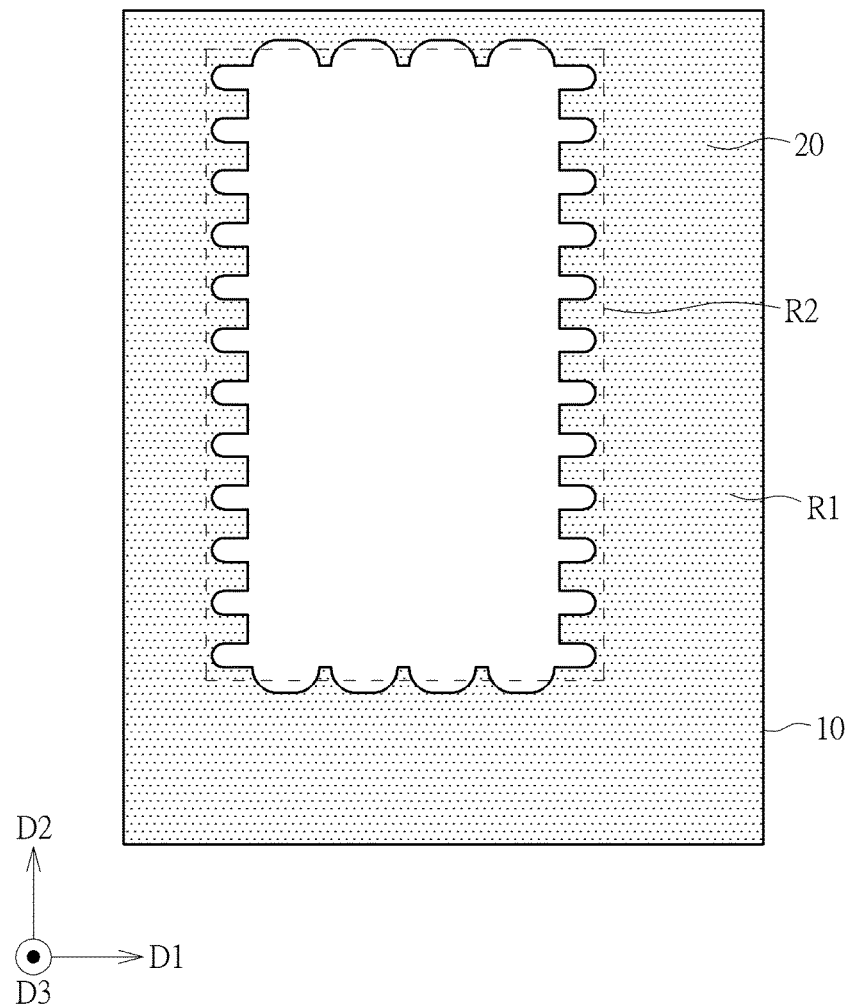
Figure 12:
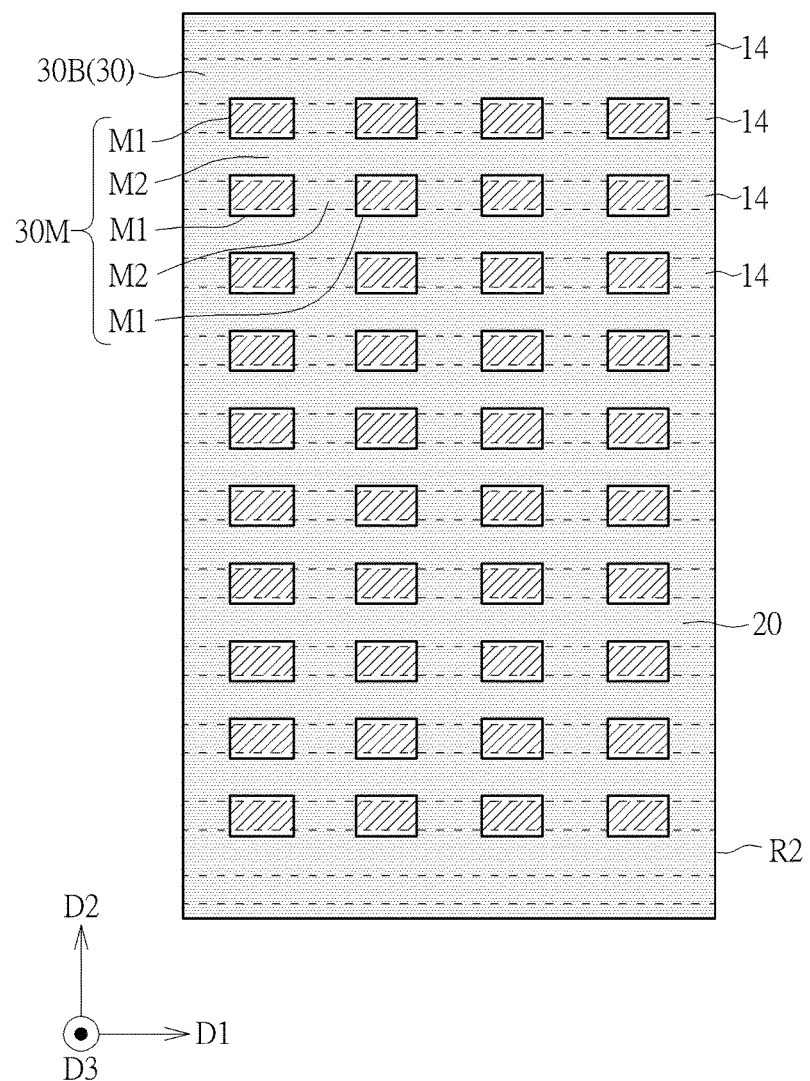

Please refer to FIGS. 10-12. FIGS. 10-12 are schematic drawings illustrating an etching method according to a third embodiment of the present invention. As shown in FIG. 10 and FIG. 11, the difference between the etching method in this embodiment and the etching method in the second embodiment mentioned above is that, in the patterned mask 30 of this embodiment, the openings M1 are arranged in the first direction D1 and the second direction D2 for forming an array configuration, and the shielding parts M2 are located between the adjacent openings M1 in the first direction D1 and the second direction D2. The uniformity of the etching loading effect in the second region R2 may be improved because the material layer 20 covered by the shielding parts M2 is removed by the lateral etching during the isotropic etching process. FIG. 11 is a schematic drawing illustrating the condition after the isotropic etching process and the step of removing the patterned mask in this embodiment. As shown in FIG. 10 and FIG. 11, in this embodiment, the lattice structure 30M including the openings M1 arranged in an array configuration may also be used to improve the etching uniformity of the material layer 20 located at the corners of the second region R2, and that will benefit other processes performed subsequently and enhance the manufacturing yield.

Additionally, the relative relation between the openings M1 of the patterned mask 30 and the conductive lines on the substrate 10 may be referred by the condition shown in FIG. 12, but not limited thereto. As shown in FIG. 12, in some embodiments, each of the openings M1 is located corresponding to a part of at least one of the second conductive lines 14 in the vertical direction D3. Each of the shielding parts M2 covers the material layer 20 between two adjacent second conductive lines 14, and some of the shielding parts M2 may also cover a part of the second conductive line 14 and the material layer 20 disposed thereon. It is worth noting that the width of the shielding part M2 between the adjacent openings M1 in the first direction D1 and the width of the shielding part M2 between the adjacent openings M1 in the second direction D2 may be further adjusted according to the process condition of the isotropic etching process (such as the etching rate and the etching time) for ensuring that the material layer 20 covered by the shielding parts M2 may be completely removed by the isotropic etching process.

Figure 13:
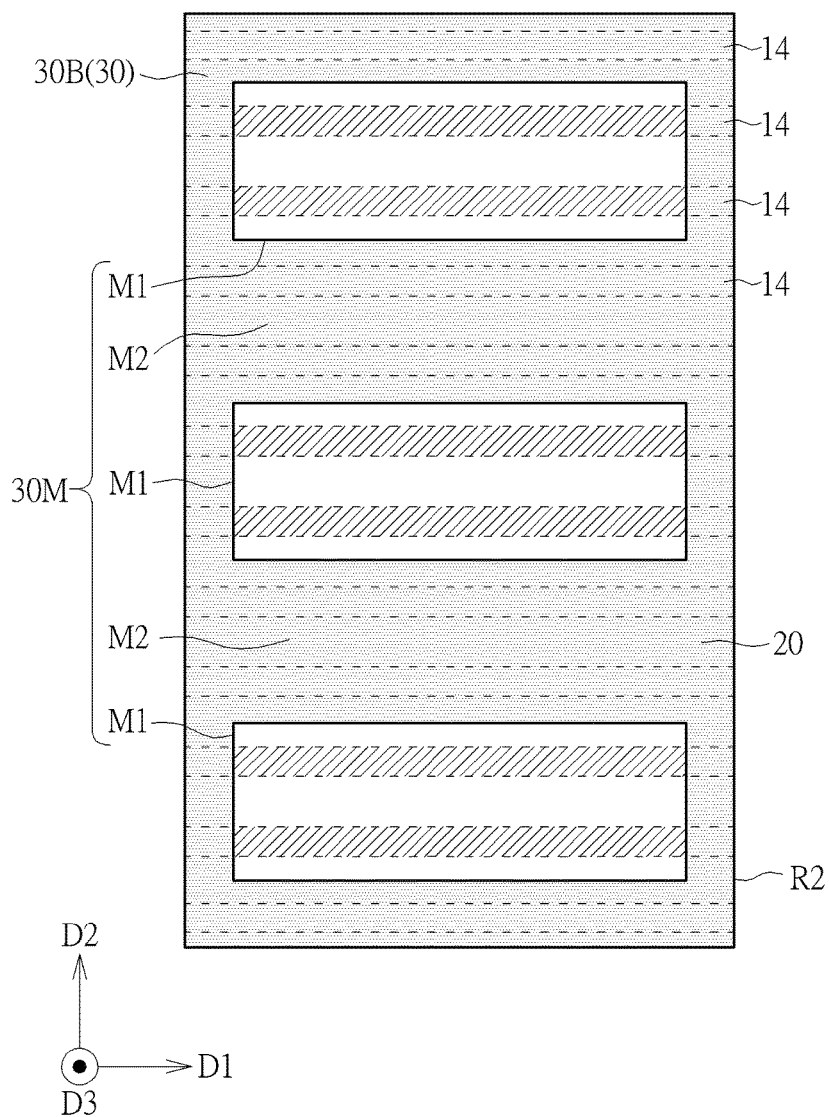
FIG. 13 is a schematic drawing illustrating an etching method according to a fourth embodiment of the present invention.
Figure 14:
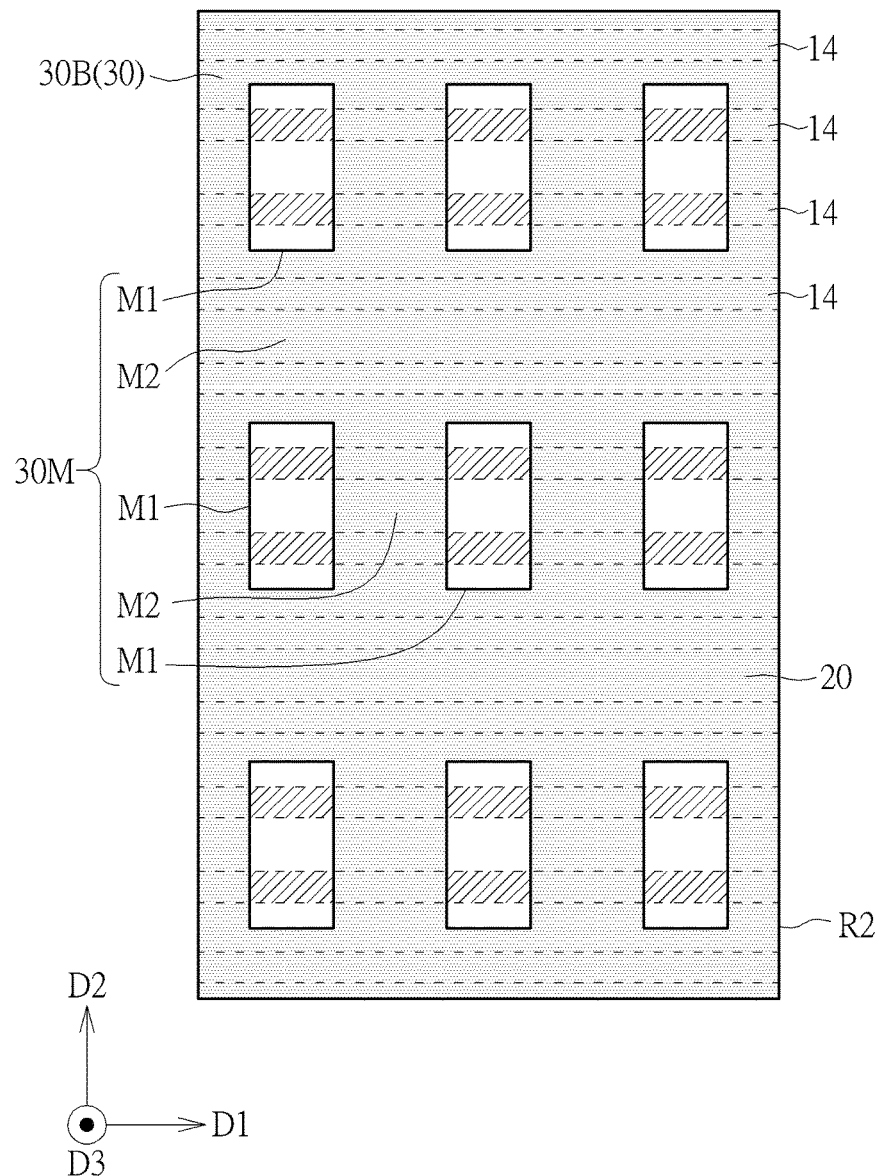
FIG. 14 is a schematic drawing illustrating an etching method according to a fifth embodiment of the present invention.

Please refer to FIG. 13 and FIG. 14. FIG. 13 is a schematic drawing illustrating an etching method according to a fourth embodiment of the present invention. FIG. 14 is a schematic drawing illustrating an etching method according to a fifth embodiment of the present invention. As shown in FIG. 13, the difference between the etching method in this embodiment and the etching method in the second embodiment mentioned above is that, in some embodiments, each of the openings M1 may be located corresponding to a part of more than one of the second conductive lines 14 in the vertical direction D3, and each of the shielding parts M2 may cover a part of more than one of the second conductive lines 14. A part of the material layer 20 located between the second conductive lines 14 may be completely covered by the patterned mask 30. As shown in FIG. 14, the difference between the etching method in this embodiment and the etching method in the third embodiment mentioned above is that, in some embodiments, each of the openings M1 arranged in an array configuration may be located corresponding to a part of more than one of the second conductive lines 14 in the vertical direction D3, and each of the shielding parts M2 may cover a part of more than one of the second conductive lines 14. A part of the material layer 20 located between the second conductive lines 14 may be completely covered by the patterned mask 30. In other words, the shielding part M2 may cover more than one of the second conductive lines 14 and the material layer 20 located between the second conductive lines 14 covered by the shielding part M2.

It is worth noting that the lattice structure 30M of the patterned mask 30 in the present invention is not limited to the conditions of the embodiments described above, and lattice structures composed of the openings and the shielding parts arranged by other approaches are within the contemplated scope of the present invention.

To summarize the above descriptions, in the etching method of the present invention, the patterned mask including the lattice structure is used to perform the isotropic etching process for improving the uniformity of the etching loading effect in the area to be etched. Additionally, the openings and the shielding parts of the lattice structure may be arranged according to the location of the conductive lines on the substrate for avoiding the residue of the etched material generated by non-uniform etching performance and the topography of the substrate. The total manufacturing yield may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An etching method, comprising:
providing a substrate, wherein a first region and a second region adjacent to the first region are defined on the substrate, and the substrate further comprises conductive lines located in the second region;
forming a material layer on the substrate, wherein the material layer is formed covering the conductive lines in the second region, and the material layer is partly located between the conductive lines;
forming a patterned mask on the material layer, wherein a part of the material layer is located between the patterned mask and the each of the conductive lines in a vertical direction, and the patterned mask comprises:
a first part covering the material layer on the first region; and
a second part located corresponding to the second region, wherein the second part comprises a lattice structure, and the lattice structure comprises:
openings, wherein each of the openings exposes a part of the material layer on the second region, and each of the openings is located corresponding to a part of at least one of the conductive line in the vertical direction; and shielding parts, wherein each of the shielding parts is located between the openings adjacent to one another, and each of the shielding parts covers at least a part of the material layer located between two of the conductive lines adjacent to each other; and performing an isotropic etching process to remove the material layer exposed by the openings and the material layer covered by the shielding parts.

2. The etching method according to claim 1, wherein the material layer covered by the shield parts is completely removed by a lateral etching of the isotropic etching process.

3. The etching method according to claim 1, wherein each of the openings is elongated in a first direction, and the openings are repeated arranged in a second direction.

4. The etching method according to claim 1, wherein the openings are arranged in a first direction and a second direction for forming an array configuration.

5. The etching method according to claim 1, wherein each of the openings is located corresponding to a part of more than one of the conductive lines in the vertical direction.

6. The etching method according to claim 1, wherein each of the shielding parts covers more than one of the conductive lines and the material layer located between the conductive lines covered by the shielding part.

7. The etching method according to claim 1, wherein each of the conductive lines is elongated in a first direction, and the conductive lines are repeatedly arranged in a second direction.

8. The etching method according to claim 1, wherein each of the conductive line comprises a bit line.

9. The etching method according to claim 8, wherein the second region comprises a memory cell region, and the first region comprises a peripheral circuit region.

10. The etching method according to claim 9, wherein the substrate further comprises gate structures located in the first region, and the material layer comprises a spacer material layer conformally formed on the conductive lines and the gate structures.

* * * * *